Dec. 1, 1970 H. G. DILL 3,544,399

INSULATED GATE FIELD-EFFECT TRANSISTOR (IGFET) WITH SEMICONDUCTOR GATE ELECTRODE

Filed Oct. 26, 1966 2 Sheets-Sheet 1

Hans G. Dill,
INVENTOR.
BY.
W. H. MacAllister Jr.
ATTORNEY.

Hans G. Dill,
INVENTOR.
BY.
W. H. Allister, Jr.
ATTORNEY.

United States Patent Office 3,544,399

Patented Dec. 1, 1970

3,544,399

INSULATED GATE FIELD-EFFECT TRANSISTOR (IGFET) WITH SEMICONDUCTOR GATE ELECTRODE

Hans G. Dill, Costa Mesa, Calif., assignor to Hughes Aircraft Company, Culver City, Calif., a corporation of Delaware Filed Oct. 26, 1966, Ser. No. 589,547
Int. Cl. H01l 7/34
U.S. Cl. 148—187 5 Claims

ABSTRACT OF THE DISCLOSURE

An insulated gate field-effect transistor in which the gate member is of semiconductor material formed on and insulated from the semiconductor body prior to the formation of the source and drain so that the gate may be used as a mask against diffusion to form the source and drain regions without critical and difficult gate alignment problems.

This invention relates to transistor devices and especially to transistor devices in which the conductivity of a relatively shallow region in a semiconductor body is modulated by means of an electric field. More particularly, the invention relates to transistor structures of the type known as insulated gate field-effect transistors.

Operation of transistors of the type to which the present invention appertains is based upon the control of the conductivity of a conduction channel in a semiconductor body which channel is induced by an electric field established therein by an insulated control gate as well as by surface charges which may be ionic in nature. The transistors of the present invention are usually formed by deposition and diffusion techniques. In the transistors of the present invention, majority charge carriers (electrons or holes) flow through the solid state semiconductor material from an electrode usually called the "source." The conductive path for these charge carriers, hereinafter called the "channel," is induced by an electric field and surface charges and occurs at surface and near-surface regions of the semiconductor body. In the absence of this induced channel, the flow of such charge carriers cannot occur. The charge carriers move or flow in the induced channel toward a second electrode called the "drain." The field effect in the semiconductor is established by a control or "gate" electrode and by this gate the conductivity of the channel and hence the electron or hole current reaching the drain can be varied. This control electrode or "gate" is insulated from the semiconductor material to prevent the majority carriers from flowing to it. Normally these devices are operated in a drain-voltage region where the drain current saturates or reaches a maximum, nearly constant value because the channel is pinched off or terminated very close to the drain region and acts as a current generator, the current being only a function of the gate voltage and not of the drain voltage. Thus, these devices basically exhibit the useful drain voltage-drain current characteristic similar to a vacuum pentode.

Such devices are known in the art and the structure and operation thereof have been amply described, especially by Hofstein and Heiman in an article entitled "Silicon Insulated-Gate Field-Effect Transistor," published in the September 1962 Proceedings of the I.E.E.E., commencing on page 1190. In one arrangement, the field-effect transistors have the source and drain electrodes disposed side-by-side with the gate arranged over the space between the source and drain and separated therefrom by an insulator. A typical prior art arrangement is shown in the above-mentioned article by Hofstein and Heiman. The gate electrode is insulated from the semiconductor material so that the gate electrode will not itself act as a source or drain electrode and may yet exert its control by field effect in the space between the source and drain electrodes.

It will be appreciated that it is highly desirable to precisely position the gate, which in prior art devices is generally of metal, over the channel region between the source and drain electrodes of the device. This permits the channel region between the source and drain to be completely modulated by the gate. If the gate is too wide relative to the channel region, undesirable and excessive stray capacitance is developed which reduces the frequency response of the device. If the gate is too small relative to the channel region and does not cover it in its entirety, undesirable ohmic losses are introduced into the device and low transconductance may result. The mask alignment problems involved in prior devices having a small channel region are severe since an extremely narrow gate must be precisely fitted over the channel region. Often in such prior art devices some compromise was accepted and the gate electrode was intentionally permitted to overlap the drain electrode in order to relieve the mask alignment problem. As noted, this results in the introduction of an undesirable feedback capacitance usually referred to as Miller feedback capacitance. In addition, the useful drain potential of these devices is usually limited by a high field breakdown on the drain by avalanche multiplication due to the field between the gate and the drain in the pinch-off region. This means that the breakdown potential of the drain is undesirably low.

It is, therefore, an object of the present invention to provide an improved field-effect device.

A further object of the invention is to provide an improved field-effect transistor of the insulated gate type.

Another object of the invention is to provide an improved field-effect transistor of the insulated gate type and characterized by low Miller feedback capacitance.

Still another object of the invention is to provide an improved field-effect transistor having a source-drain channel effectively controlled by an insulated gate structure.

Yet another object of the invention is to provide an improved field-effect transistor in which an insulated gate is precisely located over the channel region between the source and drain regions thereof.

Another object of the invention is to provide an improved method for fabricating field-effect devices of the insulated gate type.

Still another object of the invention is to provide an improved method for locating an insulated gate over the channel region in a field-effect transistor which avoids critical and difficult gate alignment problems.

These and other objects and advantages of the invention are achieved by forming an insulated gate member on a semiconductor body prior to establishing the source and drain regions therein. The gate itself is used as a part of the masking necessary to form the source and drain regions. According to the invention, the gate is formed of silicon instead of metal and this allows one to deposit and diffuse the proper conductivity-type-determining impurities into portions of the semiconductor exposed adjacent the gate member to form the source and drain regions.

The invention will be described in greater detail by reference to the drawings in which:

FIGS. 1(*a*) through 1(*h*) are cross-sectional elevational views of a portion of a field-effect device according to the invention at various steps in the manufacture thereof;

Figure 1A:
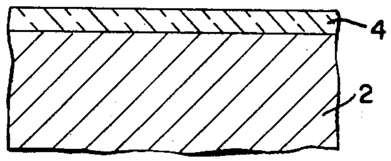
Figure 1B:
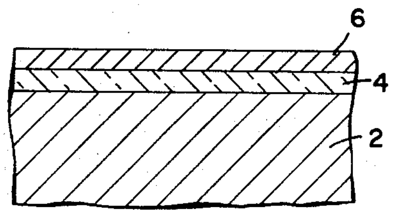
Figure 1C:
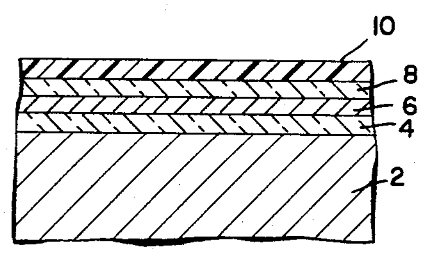
Figure 1D:
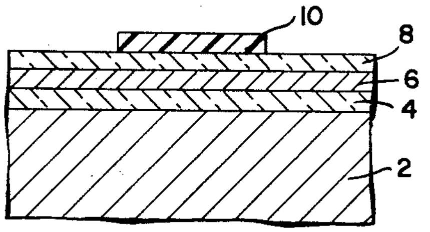
Figure 1E:
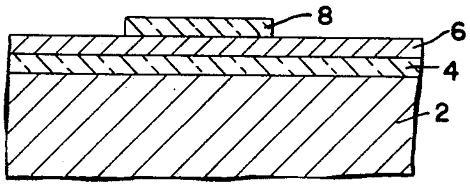
Figure 1F:
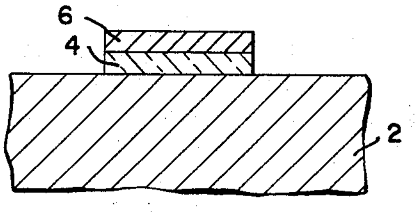
Figure 1G:
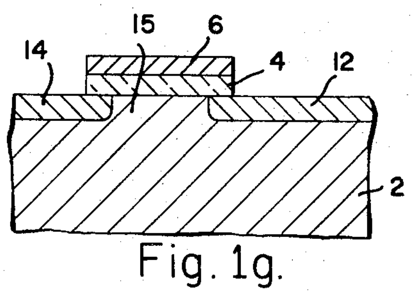
Figure 1H:
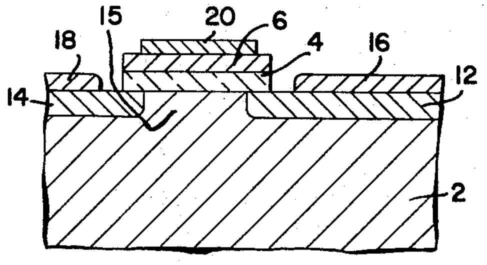

Referring now to FIGS. 1(*a*) through 1(*h*), the fabrication of a field-effect transistor device will be described. The present invention is concerned primarily with the gate electrode arrangement and the fabrication arrangement and the fabrication thereof. However, in the following paragraphs the steps necessary to form the source and drain regions, the gate structure, the insulation for the gate, and the necessary electrical contacts to the source, drain, and gate will be explained. It should also be understood that, while the fabrication of a single device is described, in practice a large number of identical devices on a common semiconductor body may be formed simultaneously and subsequently separated therefrom to yield discrete devices.

FIG. 1(*a*) shows a semiconductor body 2 which may be of N-type silicon, for example, having a typical resistivity of about 10 ohm-centimeters. A surface of the semiconductor body 2 is provided initially with an overall electrically insulating layer 4 whose primary function is to electrically insulate the gate member to be formed on the semiconductor body. A suitable material for this purpose is silicon dioxide which may be formed by heating the silicon semiconductor body 2 in an oxidizing atmosphere. Typically, such an insulating layer may be provided by heating the silicon body 2 to about 1150° C. in steam until a layer of silicon dioxide about 0.1 micron thick, for example, is obtained.

Thereafter, by pyrolysis of a silicon compound or by evaporating or electron beam sputtering silicon, a layer 6 of silicon is formed over the oxide layer 4 as shown in FIG. 1(*b*). To deposit the silicon layer by pyrolysis, the silicon substrate 2 is heated to about 1000° C. and exposed to an atmosphere containing the gas $SiH_4$ which decomposes and forms the layer 6 of silicon over the oxide layer 4. Since the silicon layer 6 is formed on an alien material (that is, material other than single crystalline silicon) or oxide, the layer 6 will probably be polycrystalline. For the purposes of the invention, the crystalline form of the silicon layer 6 is not important and may be single or polycrystalline to equal advantage.

The next step is to form the gate structure itself from the silicon layer 6 just deposited. Under some circumstances it might be possible to proceed to form the gate by masking the desired portion of the silicon layer 6 with a suitable photoresist which is a material capable of being selectively insensitized to chemical attack by exposure to a prescribed light pattern and thereafter removed when and as desired. However, it has been found difficult to selectively and satisfactorily etch silicon with most photoresist materials. Hence, it is preferable to form an intermediate mask against etching in order to satisfactorily etch away the silicon layer 6 except where desired. This may be accomplished by forming a second layer 8 of silicon dioxide over the silicon layer 6 and then by means of a photoresist layer 10 form a mask from the silicon dioxide layer 8 as shown in FIG. 1(*c*). Thereafter, as shown in FIG. 1(*d*), the photoresist layer 10 is sensitized by light and removed to expose all of the silicon dioxide layer 8 except where desired. The exposed portions of the silicon dioxide layer 8 are then removed by etching against which the photoresist mask 10 protects the underlying silicon dioxide. As shown in FIG. 1(*e*), the result is the formation of a mask 8 of silicon dioxide from which the photoresist mask 10 has been removed. In the foregoing description, it will be understood that the second layer 8 of silicon dioxide may be formed exactly as was the first layer 4 of silicon dioxide. In addition, it is also possible to form the intermediate masking layer 8 of materials other than silicon dioxide; thus, chromium may be deposited over the silicon layer 6 and utilized for the same purpose and in the same manner as the silicon dioxide.

Thereafter, using the silicon dioxide layer 8 as a mask, the exposed portions of the silicon layer 6 are removed leaving a gate member 6 of silicon positioned on the semiconductor body 2 and electrically insulated therefrom by the silicon dioxide layer 4 as shown in FIG. 1(*f*).

The next step is to form the source and drain regions 12 and 14 by diffusing a P-type impurity into the silicon body 2 from the exposed surfaces of the body and using the silicon gate member 6 as a mask against diffusion. Such diffusion processing is well known in the art and need not be extensively described herein. This step is carried out by exposing the masked and unmasked surface portions of the silicon body to the vapor of a P-type impurity such as boron, for example, while maintaining the silicon body 2 at a temperature of about 1100° C. Atoms of the impurity penetrate the silicon body at the exposed surfaces thereof and convert the conductivity type of these surface and near-surface portions to P-type while leaving the gate-protected portions of the silicon body unaffected. Thus, as shown in FIG. 1(*g*), P-type source and drain regions 12 and 14 are formed in the silicon body 2 and separated from each other by an N-type channel region 15 which remains after the diffusion operation and unaffected thereby.

Referring now to FIG. 1(*h*), by means of a mechanical-like mask plate or other suitable masking techniques (not shown), the gate member 6 and the source and drain regions 12 and 14 are provided with electrical contacts thereto by vapor-depositing or otherwise forming an electrically conductive material or metal over the desired portions thereof. Thus the gate member 6 is provided with an electrical contact 20 and the source and drain regions 12 and 14 are provided with electrical contacts 16 and 18, respectively. These contacts may be formed by vapor-depositing a film of metal such as aluminum, chromium, or gold to a thickness of about 1000 to 4000 A. over the respective exposed surfaces. Thus electrical connections may be made to the device of the invention by means of these contact members which are all provided on the same surface of the device.

Figure 2:
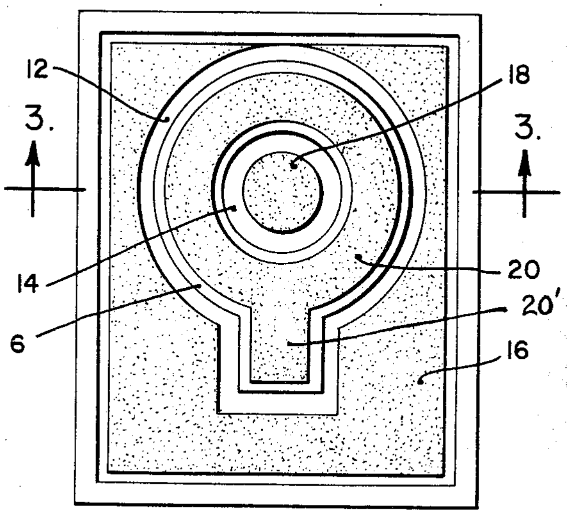
FIG. 2 is a plan view of a completed field-effect device.
Figure 3:
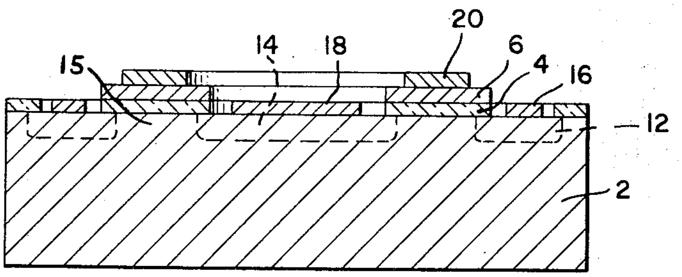
FIG. 3 is a cross-sectional elevational view of the completed field-effect device shown in FIG. 2 taken along the line 3—3 thereof.

In FIGS. 2 and 3, a complete field-effect device fabricated according to the invention is shown. While the geometry shown is essentially circular, the practice of the invention is not limited thereto. As shown, a circular N-type drain region 14 is surrounded by an annular channel-forming region of P-type conductivity which in turn is surrounded by an N-type source region 12. Disposed over the P-type channel region is the insulation layer 4 and over the insulation layer is the silicon gate member 6 and the contact 20 therefor. The metallic contact 20 to the gate 6 may be provided with a tab-like extension 18′ to facilitate the making of circuit connections as by the thermo-compression bonding of a wire thereto. Disposed on the drain region 14 is a circular metallic contact member 18 to which circuit connections may also be made as by thermo-compression bonding. The source regions 12 is substantially covered by the metallic contact member 16. In actual practice, this contact member 16 does not need to be disposed over all of the source region 12 but only on a portion thereof; for example, the source contact 16 may be in the form of a horseshoe or U disposed on the source region 12. After the fabrication of the device is completed, the surface may be provided against deleterious effects by disposing a protective layer of silicon oxide or glass, for example, over the surface leaving appropriate desired portions of the source, gate, and drain contact members exposed therethrough for the desired circuit connections.

There thus has been described a novel insulated-gate field-effect transistor device and method of fabrication thereof. Devices according to the invention have a precisely located gate which is less difficult to fabricate than heretofore. In addition, Miller feedback capacitance which is important for the high frequency stability of any amplifier is very low in devices according to the invention and even approaches values familiar with vacuum tube pentodes.

What is claimed is:

1. The method of fabricating a semiconductor device comprising the steps of:
   (a) disposing a layer of electrically insulating matedial on a portion of the surface of a semiconductor body of a first type of conductivity with adjacent portions of said surface of said semiconductor body being exposed;
   (b) forming a body of semiconductor material on said layer of electrically insulating material;
   (c) and diffusing thereafter into said exposed adjacent surface portions of said semiconductor body a conductivity-type-determining impurity capable of establishing the opposite type of conductivity in said semiconductor body to said first type of conductivity.

2. The method of fabricating a semiconductor device comprising the steps of:
   (a) disposing a layer of silicon oxide on a portion of a silicon body of a first type of conductivity with adjacent portions of said surface of said silicon body being exposed;
   (b) forming a body of silicon on said layer of silicon oxide;
   (c) and diffusing thereafter into said exposed adjacent surface portions of said silicon body a conductivity-type-determining impurity capable of establishing the opposite type of conductivity in said silicon body to said first type of conductivity.

3. The method of fabricating a semiconductor device comprising the steps of:
   (a) disposing a layer of electrically insulating material on a portion of the surface of a semiconductor body of a first type of conductivity with adjacent portions of said surface of said semiconductor body being exposed;
   (b) forming a mask of semiconductor material on said layer of electrically insulating material;
   (c) diffusing into said exposed adjacent surface portions of said semiconductor body a conductivity-type-determining impurity capable of establishing the opposite type of conductivity in said semiconductor body to said first type of conductivity;
   (d) and leaving said mask in situ to serve as a gate electrode member for said device.

4. The method according to claim 3 wherein said semiconductor body is silicon, said layer of electrically insulating material is silicon oxide and said mask is silicon.

5. A method for making a semiconductor structure having a diffused region of one conductivity type in a semiconductor substrate of the opposite conductivity type which comprises forming an insulating layer on said semiconductor substrate, forming a silicon layer over selected portions of said insulating layer, etching away the exposed portions of said insulating layer, diffusing impurities into the exposed portions of said semiconductor substrate to form said diffused region and simultaneously or separately diffusing impurities into the silicon layer to render it conductive.

References Cited

UNITED STATES PATENTS

| | | | |
|---|---|---|---|
| 3,102,230 | 8/1963 | Kahng | 323—94 |
| 3,189,973 | 6/1965 | Edwards et al. | 29—25.3 |
| 3,355,637 | 11/1967 | Johnson | 317—235 |
| 3,421,055 | 1/1969 | Bean | 317—234 |
| 3,475,234 | 10/1969 | Kerwin et al. | 148—189 |

OTHER REFERENCES

Lehman: I.B.M. Tech. Discl. Bull., vol. 8, No. 4, September 1965, p. 675.

L. DEWAYNE RUTLEDGE, Primary Examiner

R. A. LESTER, Assistant Examiner

U.S. Cl. X.R.

29—571, 578